(12) United States Patent
Watanabe (10) Patent No.: US 8,035,462 B2
(45) Date of Patent: Oct. 11, 2011

(54) RESONANT CIRCUIT, METHOD OF PRODUCING SAME, AND ELECTRONIC DEVICE

(75) Inventor: Toru Watanabe, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 300 days.

(21) Appl. No.: 12/486,669

(22) Filed: Jun. 17, 2009

(65) Prior Publication Data

US 2009/0315646 A1 Dec. 24, 2009

(30) Foreign Application Priority Data

Jun. 18, 2008 (JP) ................................. 2008-158847
Mar. 26, 2009 (JP) ................................. 2009-075911

(51) Int. Cl.
*H03H 9/125* (2006.01)
*H03H 9/24* (2006.01)
*H03H 3/007* (2006.01)
*H03B 7/06* (2006.01)

(52) U.S. Cl. ..................... 333/186; 331/115; 331/116 R; 331/154; 438/48

(58) Field of Classification Search .................. 333/186; 331/115, 116 R, 154; 438/48, 50–52
See application file for complete search history.

(56) References Cited

U.S. PATENT DOCUMENTS

| | | | |
|---|---|---|---|
| 4,959,515 A * | 9/1990 | Zavracky et al. | 200/181 |
| 5,914,553 A * | 6/1999 | Adams et al. | 310/309 |
| 6,249,073 B1 | 6/2001 | Nguyen et al. | |
| 6,424,074 B2 | 7/2002 | Nguyen | |
| 6,621,134 B1 * | 9/2003 | Zurn | 257/415 |
| 6,624,726 B2 * | 9/2003 | Niu et al. | 333/197 |
| 7,402,449 B2 | 7/2008 | Fukuda et al. | |
| 2005/0245011 A1 | 11/2005 | Tada et al. | |
| 2006/0180898 A1 | 8/2006 | Funaki et al. | |
| 2009/0049911 A1 | 2/2009 | Fukuda et al. | |
| 2009/0064785 A1 | 3/2009 | Fukuda et al. | |

FOREIGN PATENT DOCUMENTS

| | | |
|---|---|---|
| JP | 2004-058228 A | 2/2004 |
| JP | 2006-228989 A | 8/2006 |
| JP | 2006-263902 A | 10/2006 |

* cited by examiner

*Primary Examiner* — Barbara Summons

(74) *Attorney, Agent, or Firm* — Kilpatrick Townsend & Stockton LLP (57) ABSTRACT

A resonant circuit includes a substrate; a MEMS resonator including a fixed electrode and a movable electrode formed above the substrate and having a first terminal and a second terminal, the movable electrode having a movable portion opposing at least a part of the fixed electrode; and a voltage applying unit applying a bias voltage to the MEMS resonator, the voltage applying unit including a voltage divider circuit that includes a compensation resistance formed of a same layer as that of the movable portion to allow a resistance value to be changed by a thickness of the layer and a reference resistance formed of a layer different from that of the movable portion and connected to the compensation resistance to output a junction potential between the compensation resistance and the reference resistance to at least one of the first and the second terminals of the MEMS resonator.

15 Claims, 8 Drawing Sheets

RESONANT CIRCUIT, METHOD OF PRODUCING SAME, AND ELECTRONIC DEVICE

BACKGROUND

1. Technical Field

The present invention relates to a resonant circuit, a method for producing the resonant circuit, and an electronic device. Particularly, the invention relates to a structure of a resonant circuit utilizing a MEMS resonator and a method for producing the resonant circuit, as well as to an electronic device including the resonant circuit.

2. Related Art

In the recent electronic device market, products using MEMS (micro electro-mechanical system) technology are becoming increasingly popular. The MEMS products are electro-mechanical devices (MEMS devices) having a micro structure (a MEMS structure) formed on a substrate by using a semiconductor-manufacturing technology. Specific examples of the devices using the MEMS technology include micro sensors such as acceleration sensors, angular velocity sensors, inertial sensors, and pressure sensors. Market demands for the sensors are rapidly growing these days. Thus, the MEMS technology has great potential in creating new devices. In the future, a variety of practical applications of the MEMS devices, alone or in combinations, are expected to be sequentially achieved by utilizing characteristics of micro structures such as micro mechanical relays (switches) and variable capacitance elements.

Figure 3A:
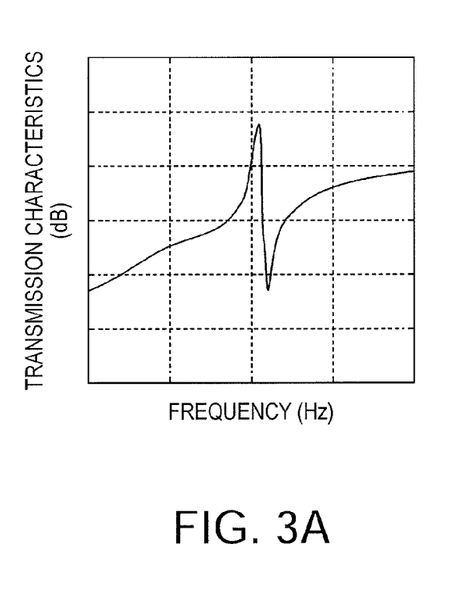
FIGS. 3A and 3B are graphs showing transmission characteristics of and a phase shift of the resonator.
Figure 3B:
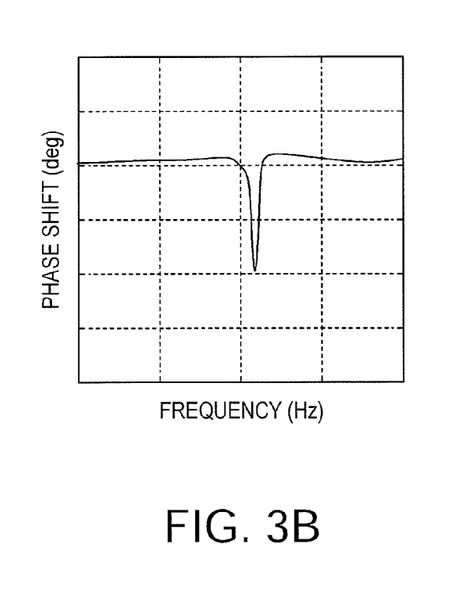

A new practical example of the MEMS technology is a resonant circuit including a MEMS resonator. The resonant circuit with the MEMS resonator is typically operated by an electrostatic driving and capacitive sensing system or a piezoelectric driving and piezoresistive sensing system. Particularly, the former system is highly consistent with a semiconductor process such as a CMOS process and thus can be regarded as an effective system for miniaturization and cost reduction. In the electrostatic driving and capacitive sensing system, there is formed a MEMS resonator having a movable electrode and a fixed electrode to sense electrostatic force-induced vibration of the movable electrode by a change in capacitance between the movable electrode and the fixed electrode. FIGS. 3A and 3B show common examples of transmission characteristics and phase characteristics of a resonant circuit. Examples of the resonant circuit shown in the drawings are disclosed in U.S. Pat. Nos. 6,249,073, 6,424,074, and JP-A-2004-58228.

In the resonant circuit described above, the resonance frequency is changed by structural size variation in the MEMS resonator. Accordingly, to secure precision of resonance frequency, it is necessary to reduce variations in structural sizes of the resonator in production of the resonant circuit. If the variations cannot be reduced, the resonance frequency needs to be corrected at a trimming step or the like performed after the production. This makes a production process of the resonant circuit complicate, leading to an increase in production cost.

Among the structural sizes of the MEMS resonator, particularly, a thickness of a movable portion of the movable electrode has directly great influence on the resonance frequency. In addition, the movable portion has an extremely small thickness of a few um or smaller, so that even a small thickness variation causes a significant change in the resonance frequency.

SUMMARY

Therefore, the present invention has accomplished to solve the problem. An advantage of the invention is to provide a resonant circuit that can suppress resonance frequency change caused by structural size variation in a resonator. Another advantage of the invention is to provide a method for producing the resonant circuit, and still another advantage of the invention is to provide an electronic device including the resonant circuit.

In light of the above-described circumstances, a resonant circuit according to a first aspect of the invention includes a substrate; a MEMS resonator including a fixed electrode and a movable electrode formed above the substrate and having a first terminal and a second terminal, the movable electrode having a movable portion opposing at least a part of the fixed electrode; and a voltage applying unit applying a bias voltage to the MEMS resonator, the voltage applying unit including a voltage divider circuit that includes a compensation resistance formed of a same layer as that of the movable portion to allow a resistance value to be changed by a thickness of the layer and a reference resistance formed of a layer different from that of the movable portion and connected to the compensation resistance to output a junction potential between the compensation resistance and the reference resistance to at least one of the first and the second terminals of the MEMS resonator.

In the resonant circuit of the first aspect, the voltage applying unit includes the compensation resistance formed of the same layer as that of the movable portion. Thus, when the thickness of the layer of the movable portion changes, the resistance value of the compensation resistance changes due to the change in the thickness of the same layer. The resistance-value change in the compensation resistance changes the output potential of the voltage divider circuit, resulting in a change in the bias voltage. Accordingly, when an amount of a change in the resonance frequency due to the change of the thickness of the movable portion is compensated by the change in the bias voltage, the resonance frequency change is autonomously suppressed, thereby enabling precision of the resonance frequency to be improved and stabilized. Keeping the precision of the resonance frequency within a permissible range enables a trimming step or the like to be omitted.

Preferably, in the resonant circuit, the voltage applying unit outputs the junction potential to one of the first and the second terminals of the MEMS resonator and outputs another potential to the other one of the terminals of the MEMS resonator. In the resonant circuit, the voltage applying unit supplies the potentials to both terminals of the MEMS resonator by outputting the junction potential to the one of the first and the second terminals of the resonator and outputting the another potential to the other one of the terminals thereof. This can ensure that an arbitrary bias voltage is applied to the MEMS resonator.

In this case, preferably, in the voltage divider circuit, the compensation resistance and the reference resistance are connected in series between a high potential and a low potential; and when the junction potential is higher than the another potential, the compensation resistance is connected to the high potential and the reference resistance is connected to the low potential, whereas when the junction potential is lower than the another potential, the compensation resistance is connected to the low potential and the reference resistance is connected to the high potential. Thereby, when the junction potential is higher than the another potential, the compensation resistance receives a potential higher than that of the reference resistance in the voltage divider circuit. Accordingly, when the thickness of the layer of the compensation resistance is negatively correlated with the junction potential (namely, when the thickness of the resistance layer is reduced and the resistance value is increased), a reduction in the junction potential leads to a reduction in the bias voltage, thereby suppressing the change in the resonance frequency. Conversely, when the junction potential is lower than the another potential, the compensation resistance receives a potential lower than that of the reference resistance. Accordingly, in the case of the negative correlation between the thickness of the compensation resistance layer and the junction potential (when the resistance layer thickness is reduced and the resistance value is increased), an increase in the junction potential leads to a reduction in the bias voltage, thus suppressing the change in the resonance frequency. Therefore, in both the cases, the compensation resistance can be formed of the resistance layer having the resistance value negatively correlated with the layer thickness, so that the compensation resistance can be formed of an ordinary resistance layer, namely, a resistance layer having a pair of connection terminals at end portions thereof.

Preferably, the resonant circuit of the aspect further includes an input coupling capacitance and an output coupling capacitance, the input coupling capacitance being connected between the first terminal of the MEMS resonator and an input terminal of the resonant circuit, and the output coupling capacitance being connected between the second terminal of the MEMS resonator and an output terminal of the resonant circuit. In this manner, the MEMS resonator is galvanically isolated from an external circuit by the input coupling capacitance connected between the first terminal of the resonator and the input terminal of the resonant circuit and the output coupling capacitance connected between the second terminal of the resonator and the output terminal of the resonant circuit. Accordingly, regardless of any potential of the external circuit, a desired bias voltage can be applied to the MEMS resonator, thereby enabling suppression effect on the resonance frequency change to be increased.

A resonant circuit according to a second aspect of the invention includes a substrate; a MEMS resonator including a fixed electrode and a movable electrode formed above the substrate and having a first terminal and a second terminal, the movable electrode having a movable portion opposing at least a part of the fixed electrode; and a voltage applying unit including a first circuit supplying a first potential to the first terminal of the MEMS resonator and a second circuit supplying a second potential to the second terminal of the MEMS resonator to apply a bias voltage corresponding to a difference between the first and the second potentials to the MEMS resonator, at least one of the first and the second circuits being a voltage divider circuit including a compensation resistance formed of a same layer as that of the movable portion to allow a resistance value to be changed by a thickness of the layer and a reference resistance formed of a layer different from that of the movable portion and connected to the compensation resistance to output a junction potential between the compensation resistance and the reference resistance as the first potential or the second potential.

Preferably, in the resonant circuit of the first aspect, the movable portion is formed of a conductive layer made of a same material as that of the compensation resistance, whereas the reference resistance is formed of a conductive layer made of a material different from that of the conductive layer forming each of the movable portion and the compensation resistance. In this case, it is desirable that the movable portion and the compensation resistance may be formed of a polysilicon layer.

Preferably, in the resonator circuit of the first aspect, the movable portion and the compensation resistance are each formed of a conductive layer and adjacent to each other. Additionally, preferably, the movable portion and the compensation resistance are contained in a same containing space. Similarly in this case, both the movable portion and the compensation resistance are desirably formed of a polysilicon layer. In the present specification, the conductive layers are placed adjacent to each other in a condition where no other conductive member (such as a conductive layer or a wiring layer) is arranged between the conductive layers above the substrate.

Next, according to a third aspect of the invention, there is provided a method for producing a resonant circuit including a MEMS resonator having a fixed electrode and a movable electrode with a movable portion opposing at least a part of the fixed electrode and a voltage applying unit applying a bias voltage to the MEMS resonator. The method includes forming the movable portion and a compensation resistance using a same layer, and forming a reference resistance using a layer different from that of the movable portion and the compensation resistance, so as to form a voltage divider circuit including the compensation resistance and the reference resistance in the voltage applying unit to output a junction potential between the compensation resistance and the reference resistance to at least one of terminals of the MEMS resonator. In this case, the order of a step of forming the movable portion and the compensation resistance and a step of forming the reference resistance may be alternatively reversed.

Preferably, in the method above, the movable portion is formed of a conductive layer formed by using a same material and a same method as in the compensation resistance, whereas the reference resistance is formed of a conductive layer formed by using a material and a method different from those of the movable portion and the compensation resistance. In this case, desirably, the movable portion and the compensation resistance may be each formed of a polysilicon layer.

In addition, preferably, in the method of the aspect, the movable portion and the compensation resistance are each formed of a conductive layer and adjacent to each other. In this manner, placing the movable portion and the compensation resistance adjacent to each other can increase a similarity between film thickness values dependent on formation conditions (such as film formation conditions) for the movable portion and the compensation resistance. This can improve compensation effect of the compensation resistance on the resonance frequency.

Preferably, the production method of the third aspect further includes forming a containing space for containing both the movable portion and the compensation resistance. In the method, placing both the movable portion and the compensation resistance in the same containing space can prevent temperature increase in the compensation resistance due to a surrounding element. Additionally, at a release step for the movable portion, for example, the compensation resistance is also subjected to the influence of etching simultaneously under a same condition, whereby post processing after formation of the movable portion and the compensation resistance is the same for both of them. This can reduce influence from difference in the post processing between the movable portion and the compensation resistance, such as changes in the structural sizes, thereby improving the compensation effect of the compensation resistance on the resonance frequency. Similarly in this case, desirably, the movable portion and the compensation resistance may be formed of a polysilicon layer.

Preferably, in the method, the movable portion and the compensation resistance are both formed on a same layer. Forming both the movable portion and the compensation resistance on the same base layer can further equalize film-formation conditions for the movable portion and the compensation resistance. This can further increase the similarity of the film thickness between the movable portion and the compensation resistance, thereby further improving the compensation effect of the compensation resistance on the resonance frequency.

Next, an electronic device according to a fourth aspect of the invention includes the resonant circuit according to the first aspect and a signal circuit connected to the resonant circuit, the resonant circuit and the signal circuit being formed above a same substrate. In the electronic device, the resonant circuit including the MEMS resonator and the voltage applying unit can be formed integrally with the signal circuit above the same substrate. This allows formation of a compact electronic device. Particularly, when the plurality of constituent elements such as the MEMS resonator and the signal circuit are formed side by side to each other, the elements can be formed at a same step, thus improving production efficiency and reducing production cost. In this case, for example, the electronic device of the aspect is typically a semiconductor device (a semiconductor chip) including the structure integrally provided above a single semiconductor substrate.

In addition, preferably, in the electronic device of the aspect, the movable portion and the compensation resistance are both arranged in a containing space formed above the substrate.

Furthermore, preferably, in the electronic device of the aspect, the signal circuit includes an amplifier circuit having a negative resistance to form an oscillation circuit.

In addition, the substrate may be a semiconductor substrate such as a silicon substrate, a glass substrate, and a ceramic substrate, for example. In order to form the MEMS resonator for the semiconductor device, a semiconductor substrate made of silicon or the like may be desirable.

As a result, the aspects and the preferable features of the invention provide the excellent advantageous effect that suppresses resonance frequency change in the resonator caused by variation in the structural size of the movable portion to improve precision of frequency characteristics of the resonant circuit.

BRIEF DESCRIPTION OF THE DRAWINGS

The invention will be described with reference to the accompanying drawings, wherein like numbers reference like elements.

DESCRIPTION OF EXEMPLARY
EMBODIMENTS

Figure 1:
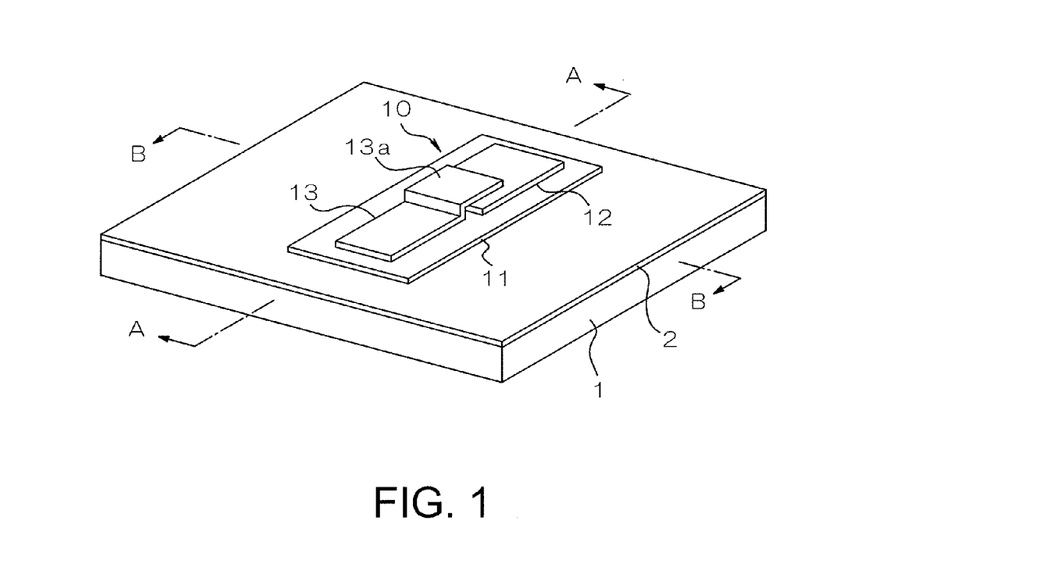
FIG. 1 is a schematic perspective view showing a structural example of a resonator included in a resonant circuit according to an embodiment of the invention.
Figure 2A:
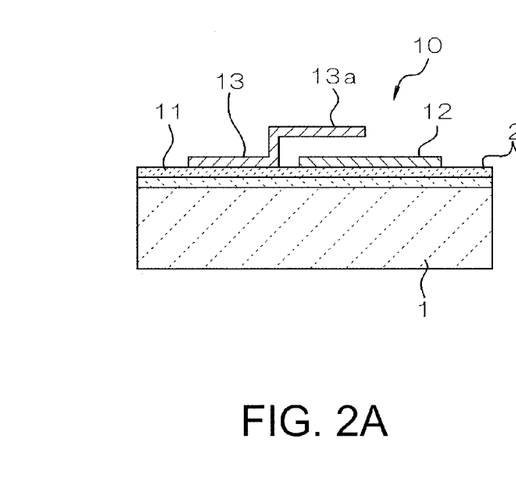
FIGS. 2A and 2B are longitudinal sectional views of the resonator.
Figure 2B:
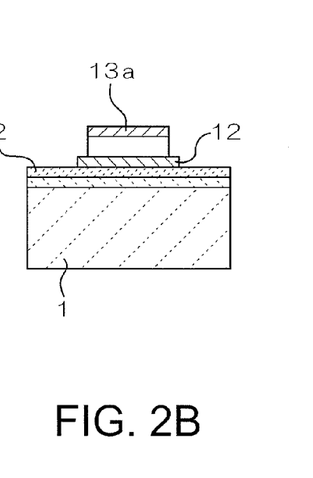

Embodiments of the invention will be described in detail with reference to the attached drawings. FIG. 1 is a schematic perspective view showing a structural example of a MEMS resonator 10 that can be used in a resonant circuit according to one of the embodiments. FIGS. 2A and 2B are sectional views of the resonator 10 showing sectional views taken along line A-A and line B-B of FIG. 1.

The MEMS resonator 10 is formed on a substrate 1 made of a semiconductor material such as monocrystalline silicon. On the substrate 1 is formed an insulating film 2 made of silicon oxide ($SiO_2$) or the like, and on the insulating film 2 is formed a base layer 11 of the resonator 10. The base layer 11 is made of silicon nitride or the like. On the base layer 11 are formed a fixed electrode 12 made of polycrystalline silicon or the like having conductivity provided by doping and a movable electrode 13 made of the same material. At least a part of the fixed electrode 12 and a movable portion 13a of the movable electrode 13 serve as resonator electrodes of the resonator 10. The at least a part of the fixed electrode 12 and the movable portion 13a of the movable electrode 13 are opposed to each other in a vertical direction relative to each other at a predetermined distance (a distance of a few um or smaller) above the substrate 1. Then, the movable portion 13a is configured to bend upward and downward in response to electrostatic attraction generated between the movable portion 13a and the fixed electrode 12 so as to be movable in a direction changing the distance between the movable portion 13 and the at least a part of the fixed electrode 12 opposing to each other.

The MEMS resonator 10 shown in FIG. 1 has a cantilevered structure in which a cantilever part of the movable electrode 13 is formed as the movable portion 13a, although this is merely an example of the resonator according to an embodiment of the invention. In the resonator according to any of the embodiments, the movable portion of the MEMS resonator can be formed as a portion having any of various shapes and structures, such as a beamed portion or a disc-shaped portion, for example.

FIGS. 3A and 3B are schematic characteristic graphs showing electrical characteristics of the MEMS resonator 10 of the resonant circuit according to the one of the embodiments of the invention. FIGS. 3A and 3B, respectively are graphs showing transmission characteristics and a phase shift, respectively, obtained when an AC signal is fed to the MEMS resonator 10. As shown in the drawings, the MEMS resonator 10 has resonance characteristics having a resonance frequency according to need. The resonance frequency represented by $f_n$, is obtained by a following formula (1):

$$f_n = (1/2\pi) \times (K_m/m_{eff})^{1/2} \quad (1)$$

In the formula (1), $K_m$ represents a spring constant determined by the structure of the MEMS resonator 10, and $m_{eff}$ represents an effective mass of the structure of the resonator 10.

Applying an appropriately predetermined bias voltage (a direct current bias voltage) between the fixed electrode 12 and the movable electrode 13 of the MEMS resonator 10 allows electrostatic attraction to be generated between the electrodes 12 and 13. The electrostatic attraction acts so as to reduce the spring constant $K_m$. Thereby, the resonance frequency $f_n$, obtained by the formula (1) is reduced. In general, the resonance frequency $f_n$, is further reduced as the bias voltage is increased.

Figure 4:
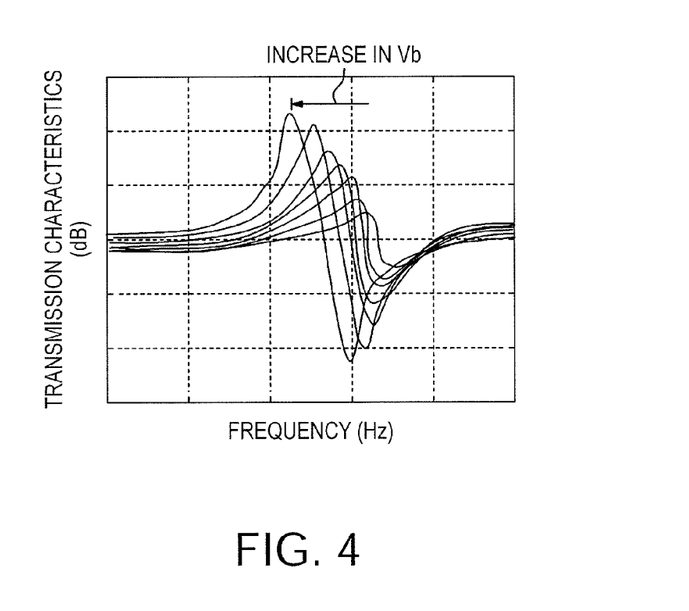
FIG. 4 is a graph showing a bias voltage dependence of the transmission characteristics of the resonator.

FIG. 4 is a graph showing resonance characteristics of an AC signal obtained by changing a bias voltage Vb applied to the MEMS resonator 10. As shown in the graph, as the bias voltage Vb is increased, the resonance frequency $f_n$, is reduced.

Figure 5:
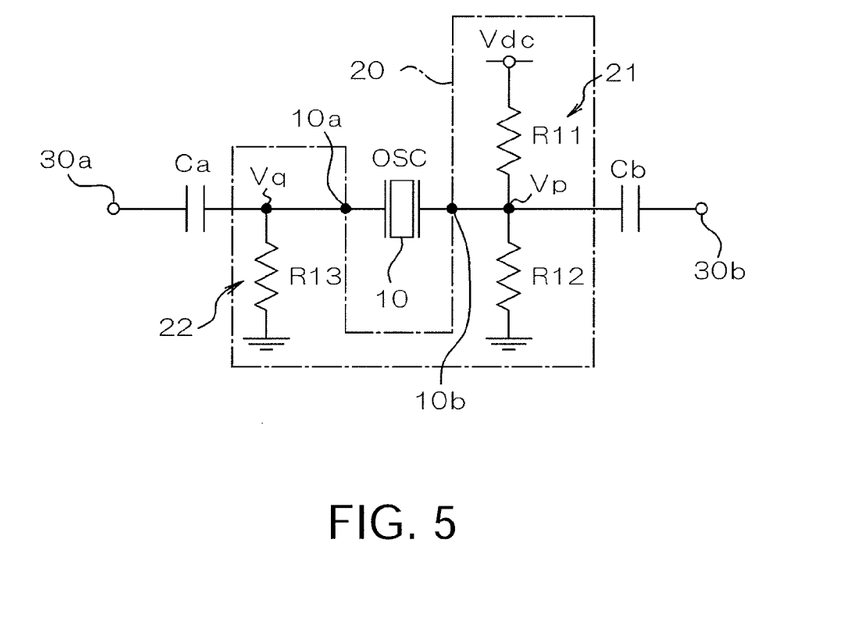
FIG. 5 is a circuit diagram showing a structure of a resonant circuit according to a first embodiment of the invention.

FIG. 5 is a circuit diagram showing a structure of a resonant circuit 30 including the MEMS resonator 10 used in the first embodiment. In the example shown in the drawing, an input terminal 30a and an output terminal 30b, respectively, of the resonant circuit 30 are connected to a first terminal 10a and a second terminal 10b, respectively, of the MEMS resonator 10. In this case, one of the first and the second terminals 10a and 10b is connected to the fixed electrode 12 and the other one thereof is connected to the movable electrode 13. Additionally, a bias circuit 20 as a voltage applying unit is connected between the first terminal (for input) 10a of the MEMS resonator 10 and the input terminal 30a and between the second terminal (for output) 10b thereof and the output terminal 30b. Furthermore, between the input terminal 30a and the first terminal 10a is connected an input coupling capacitance Ca, and between the output terminal 30b and the second terminal 10b is connected an output coupling capacitance Cb.

The bias circuit 20 is a section applying a direct current bias voltage to the terminals 10a and 10b of the MEMS resonator 10. The bias circuit 20 includes a voltage divider circuit 21 in which a voltage is applied to opposite ends of a serial circuit of a compensation resistance R11 and a reference resistance R12 serially connected to each other. In the voltage divider circuit 21 as an example shown in the drawing, a DC power supply potential Vdc as a high potential is supplied to the compensation resistance R11, and the reference resistance R12 is connected to a ground potential as a low potential. A junction potential Vp between the compensation resistance R11 and the reference resistance R12 is supplied to the second terminal for output of the MEMS resonator 10. The junction potential Vp, which is a second potential, is calculated by Vp=Dv×Vdc in accordance with the potential difference voltage Vdc at opposite ends of the voltage divider circuit 21 and a voltage division ratio Dv(R12/(R11+R12)).

In addition, the bias circuit 20 includes a potential supplying section 22 connected to the first terminal 10a for input of the MEMS resonator 12. The potential supplying section 20 is connected to a constant potential (the ground potential in the example of the drawing) via a resistance R13 to supply a first potential Vq to the input terminal 10a of the MEMS resonator 10. In the present embodiment, the resonator circuit is configured such that the junction potential Vp as the second potential is always higher than the first potential Vq. In this manner, the MEMS resonator 10 receives the bias voltage Vb(Vp−Vq) corresponding to a difference between the second potential Vp supplied by the voltage divider circuit 21 of the bias circuit 20 and the first potential Vq supplied by the potential supplying section 22. The resonant circuit 30 is used by connecting the input terminal 30a and the output terminal 30b to an external circuit. In this case, the external circuit is galvanically isolated from the MEMS resonator 10 by the input coupling capacitance Ca and the output coupling capacitance Cb. Thus, the MEMS resonator 10 receives only the bias voltage Vb as a DC bias supplied by the bias circuit 20.

In the first embodiment, the voltage divider circuit 21 supplies the second potential Vp to the second terminal 10b for output of the MEMS resonator 10, and the potential supplying section 22 supplies the first potential Vq as another potential to the first terminal 10a for input of the resonator 10. Conversely, the voltage divider circuit 21 may supply the potential Vp as the first potential to the first terminal 10a for input, and the potential supplying section 22 may supply the another potential Vq as the second potential to the second terminal 10b for output. Additionally, the bias circuit 20 may include only the voltage divider circuit 21 supplying the potential Vp to one of the first and the second terminals of the MEMS resonator 10. Furthermore, in the above example, the potential Vq is lower than the potential Vp supplied from the voltage divider circuit 21. However, for example, the potential Vq may be connected to a high potential via the resistance R13 to be made higher than the potential Vp supplied from the voltage divider circuit 21.

Figure 6:
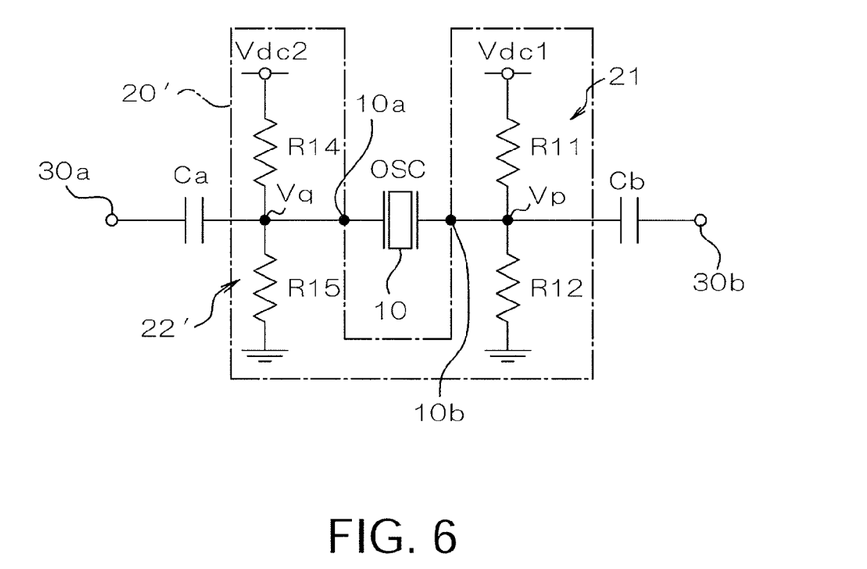
FIG. 6 is a circuit diagram showing a structure of a resonant circuit according to a second embodiment of the invention.

FIG. 6 is a circuit diagram showing a structure of a resonant circuit 30' according to a second embodiment of the invention. The second embodiment is structured in the same manner as in the first embodiment, excepting that a bias circuit 20' is provided to supply the potentials Vp and Vq from voltage divider circuits to opposite ends of the MEMS resonator 10. Thus, descriptions of the same parts as those in the resonant circuit 30 will be omitted below.

In the resonant circuit 30' of the second embodiment, the second terminal 10b (for output) of the MEMS resonator 10 is connected to the voltage divider circuit 21 including the compensation resistance R11 and the reference resistance R12, which are the same as those in the first embodiment. In the voltage divider circuit 21 of the second embodiment, the compensation resistance R11 is connected to a high potential Vdc1, and the reference resistance R12 is connected to a ground potential (a low potential).

In addition, the first terminal 10a (the input terminal) of the MEMS resonator 10 is connected to a voltage divider circuit 22' including a reference resistance R14 and a compensation resistance R15. In the voltage divider circuit 22', the reference resistance R14 is connected to a high potential Vdc2, and the compensation resistance R15 is connected to a ground potential (a low potential).

In this case, the first terminal 10a at an input side of the MEMS resonator 10 receives, as a first potential, a junction potential Vq of the voltage divider circuit 22' including the reference resistance R14 and the compensation resistance R15. Meanwhile, the second terminal 10b at an output side of the MEMS resonator 10 receives, as a second potential, the junction potential Vp of the voltage divider circuit 21 including the compensation resistance R11 and the reference resistance R12. Thereby, the bias voltage Vb of the MEMS resonator 10 is obtained by the difference between the potentials Vp−Vq as above. Additionally, as in the first embodiment, the junction potential Vp is always set higher than the junction potential Vq.

In each of the first and the second embodiments, the compensation resistance R11 is made of a same film (layer) as the movable portion 13a of the resonator 10. For example, the movable portion 13 and the compensation resistance R11 may be simultaneously obtained by forming a film of a same conductive layer for each and then collectively patterning the formed conductive layers.

Figure 7:
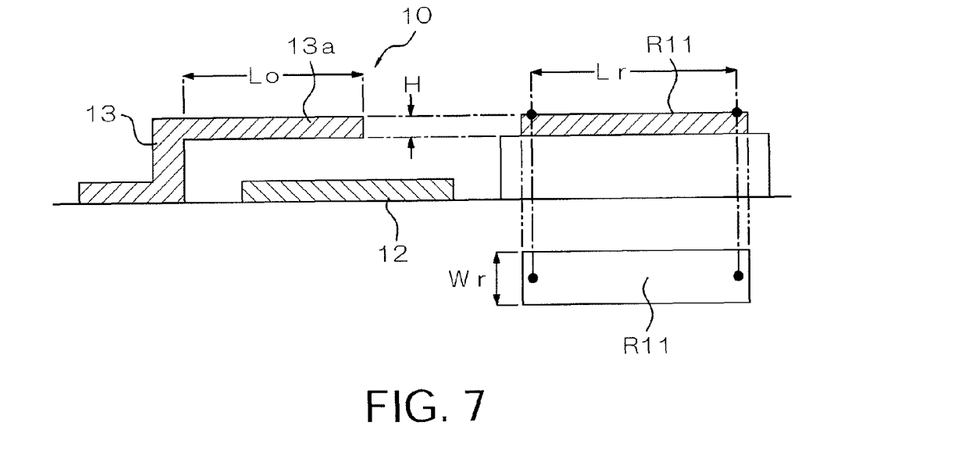
FIG. 7 is a schematic structural diagram showing a relationship of structural sizes between the resonator and a compensation resistance element in the resonant circuit.

FIG. 7 schematically shows structures of the MEMS resonator 10 and the compensation resistance R11. That is, in the drawing, the MEMS resonator 10 and the resistance R11 are shown positioned adjacent to each other regardless of an actual placement of those elements. As described above, the MEMS resonator 10 includes the fixed electrode 12 and the movable electrode 13. The movable electrode 13 has the movable portion 13a opposing at least a part of the fixed electrode 12. It is known that the resonance frequency $f_n$ of the MEMS resonator 10 is calculated by a following formula (1'), based on a thickness H of the movable portion 13a and a length Lo of a part of the movable portion 13a in a projection direction of the portion 13a (a lateral direction in the drawing). Specifically, the length Lo is a beam length, which is the length of the a part of the movable portion 13a extended in the projection direction within a range where the movable portion 13a overlaps the fixed electrode 12.

$$f_n=(1/2\pi)\times(35E/33\rho)^{1/2}\times H/Lo^2 \quad (1')$$

In the formula (1'), E represents a Young's modulus of a material of the movable portion 13a and ρ represents a density of the material thereof. Accordingly, in the formula (1'), as the thickness H of the movable portion 13a is increased, the resonance frequency $f_n$, is increased, whereas as the thickness H thereof is decreased, the resonance frequency $f_n$, is decreased. Thus, obviously, a positive correlation is observed between the thickness H and the resonance frequency $f_n$.

Meanwhile, a resistance value of the compensation resistance R11 is obtained by a following formula (2). In this case, portions near opposite ends of the compensation resistance R11 in a planar direction of the resistance R11 (near the ends of the resistance R11 in the lateral direction in FIG. 7) are used as junctions, where Lr represents a length between the ends of the compensation resistance R11; Wr represents a not-shown width of the resistance R11 orthogonal to a direction of the length Lr; and a thickness of the resistance R11 is represented by H, which is the same as that in the movable portion 13a.

$$R11=\rho r \times Lr/(Wr \times H) \quad (2)$$

In the formula (2), ρr represents a resistivity of a material of the resistance R11. Accordingly, in the formula (2), as the thickness H of a resistance layer of the compensation resistance R11 is increased, the resistance value is decreased, whereas as the thickness H is decreased, the resistance value is increased. Thus, obviously, a negative correlation is observed between the thickness H and the resistance value of the compensation resistance R11.

The reference resistance R12 has a structure different from that of the movable portion 13a. For example, the reference resistance R12 may be made of a different layer formed at another step or may be formed of an external resistance. Accordingly, while the compensation resistance R11 has the same thickness H as that of the movable portion 13a and thus the thickness of the resistance R11 varies in accordance with variation in the thickness H of the movable portion 13a, the reference resistance R12 does not necessarily link with variation in the thickness H of the movable portion 13a. In addition, in the description given above, the thickness of the movable portion 13a is the same as that of the compensation resistance R11, but the thicknesses of both the 13a and the R11 do not necessarily have to be the same. In both the movable portion 13a and the compensation resistance R11 that are formed of the same layer, there may be an increase or a decrease in the thickness due to thickness variation of the layer caused in production of the resonator circuit.

In each of the bias circuits 20 and 20', the resistance value of the resistance R11 is decreased when the thickness H is increased by a predetermined amount. Thus, the bias circuits 20 and 20' are configured such that the supplied potential Vp is increased. Specifically, with reduction of the resistance value of the compensation resistance R11, the voltage division ratio Dv is increased unless the resistance value of the reference resistance R12 is similarly reduced, thereby allowing the junction potential Vp to be changed to a high level. In this way, in the present embodiment, the thickness H is positively correlated with the bias voltage Vb(Vp−Vq). Therefore, as in the formula (1') and the characteristics shown in FIG. 4, when the resonance frequency $f_n$, is ready to be changed due to a change in the thickness H of the movable portion 13a (such as an increase in the predetermined amount), a change in the resistance value of the compensation resistance R11 resulting from the change in the thickness H leads to a change in the bias voltage, thereby suppressing the change in the resonance frequency $f_n$. This, as a whole, reduces the resonance frequency change caused by variation in the thickness of the movable portion 13a.

The description above is applied to both the first and the second embodiments. However, in the second embodiment, similarly to the compensation resistance R11, the compensation resistance R15 is made of the same layer as that of the movable portion 13a. Thereby, as the thickness H is increased, the resistance value of the compensation resistance R15 is decreased and thus the junction potential Vq of the voltage divider circuit 22' is decreased. This allows the bias voltage Vb:Vp−Vq (Vp>Vq) to be increased, as above. Consequently, the voltage divider circuit 22' also acts to suppress a change in the resonance frequency $f_n$, resulting from a change in the thickness H of the movable portion 13a.

As described above, in the second embodiment, the compensation resistance R15 as well as the compensation resistance R11 is made of the same layer as that of the movable portion 13a to change both the second voltage Vp and the first voltage Vq, thereby increasing a change rate of the bias voltage Vp caused by a change in the thickness H. Alternatively, in the example shown above, only one of the resistances R11 and R15 may be the compensation resistance. If the resistance R11 is the compensation resistance and the resistance R15 is not, the first potential Vq is connected to another constant potential, as equivalent to the first embodiment.

The description hereinabove has been provided on the precondition that the potential Vp is higher than the potential Vq. However, conversely, the potential Vq may be higher than the potential Vp. For example, in the circuit structure shown in FIG. 5, as above, the potential Vq is connected to a high potential via the resistance R13 so as to allow the potential Vq to be higher than the potential Vp supplied by the voltage divider circuit 21. When the potential Vp is lower than the potential Vq as above, the description regarding levels (high or low) of the potentials and an increase or a decrease in the potentials in the voltage divider circuit outputting the potential Vp is applicable by switching between the high and low levels of the potentials and the increase and decrease therein, respectively.

In addition, similarly to the above, when the relation: Vp>Vq in the first embodiment is switched to the relation: Vp<Vq, a connecting position of the compensation resistance R11 may be switched with a connecting position of the reference resistance R12 in the voltage divider circuit 21. In the second embodiment, connecting positions of the reference resistance R14 and the compensation resistance R15 in the voltage divider circuit 22' may be switched between each other.

In each of the embodiments, the compensation resistance R11 included in the voltage divider circuit 21 is formed of a resistance layer having a resistance value negatively correlated with the thickness of the layer. However, for example, the compensation resistance R11 may be formed of a resistance layer having top and bottom surfaces each connected to an electrode and having a resistance value positively correlated with the thickness of the layer. In this case, in the voltage divider circuit 21, the connecting position of the compensation resistance R11 may be switched with the connecting position of the reference resistance R12, and the compensation resistance R11 may be connected to a low potential side. Similarly, in the voltage divider circuit 22' of the second embodiment, the compensation resistance R15 may be connected to the high potential side and the reference resistance R14 may be connected to the low potential side when the compensation resistance R15 is formed of a resistance layer having a resistance value positively correlated with the thickness of the layer as described above.

Figure 8A:
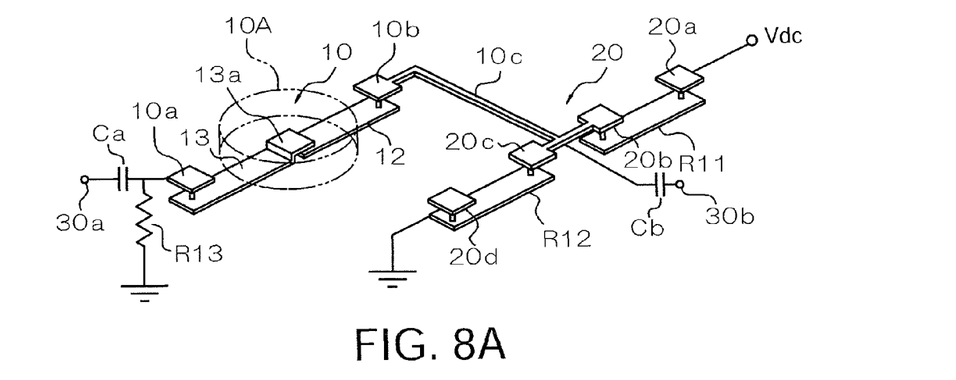
FIGS. 8A and 8B are schematic perspective views showing rather specific examples of an arrangement of constituent elements included in the resonant circuit of the first embodiment.

FIG. 8A is a schematic perspective view typically showing the arrangement of the first embodiment. In the drawing, a connection relationship among circuit elements is typically shown using lines, and there are not shown constituent elements such as a substrate, an insulating film formed on the substrate, a base layer, and an interlayer insulating film. In examples shown in the drawings, first, the fixed electrode 12 is formed of a first conductive layer formed on a substrate, and next, on the fixed electrode 12 is formed a not-shown insulating film (a sacrificial layer). Then, the movable electrode 13 and the compensation resistance R11 are formed of a second conductive layer, where the movable portion 13a of the movable electrode 13 and the resistance layer of the compensation resistance R11 are collectively formed by formation and patterning of the second conductive layer.

The resistance layer forming the reference resistance R12 is formed at a step different from a step of forming the movable portion 13a, and, for example, may be formed together with the fixed electrode 12 by formation and patterning of the first conductive layer. In this manner, the compensation resistance R11 and the reference resistance R12 are formed at different steps. However, when the resistances R11 and R12 are formed using a same material and a same film-forming method, sizes of structures formed at both steps can be similar to each other. Accordingly, preferably, at least one of the material and the forming method is different between the step of forming the reference resistance R12 and the step of forming the compensation resistance R11. For example, when one of the resistances R12 and R11 is made of conductive polycrystalline silicon, the other one of the resistances R12 and R11 may be made of a metal layer or an impurity region on the substrate. In addition, when chemical vapor deposition (CVD) is used to form one of the resistances R12 and R11, the other resistance thereof may be formed using a different method, such as sputtering, evaporation, or ion implantation.

There is formed an interlayer insulating film (not shown) on the MEMS resonator 10, the compensation resistance R11, and the reference resistance R12 that are thus formed. In addition, on the interlayer insulating film, a metal film is formed to be patterned according to need so as to form the first terminal 10a for input, the second terminal 10b for output, compensation resistance terminals 20a, 20b, reference resistance terminals 20c, 20d, and a wire 10c, which are conductively connected to a lower layer structure via through-holes formed in the interlayer insulating film. The first terminal 10a for input is conductively connected to the movable electrode 13, and the second terminal 10b for output is conductively connected to the fixed electrode 12. The second terminal 10b for output is also conductively connected to the compensation resistance terminal 20b and the reference resistance terminal 20c via the wire 10c. The compensation resistance terminal 20a and the reference resistance terminal 20b, respectively, are conductively connected to the respective opposite ends of the compensation resistance terminal R11 in a longitudinal direction extended in the planar direction of the resistance R11. The reference resistance terminals 20c and 20d, respectively, are conductively connected to respective opposite ends of the reference resistance terminal R12 in a longitudinal direction extended in a planar direction of the resistance R12.

In the structure of the resonant circuit described above, the at least a part of the fixed electrode 12 and the movable electrode 13a forming the MEMS resonator 10 are arranged in a containing space 10A (indicated by two-dotted chain lines in FIG. 8A) where the interlayer insulating film is not formed. The containing space 10A is provided by partially etching the interlayer insulating film at a release step using a method as described below, after formation of structures of the elements above the substrate. Within the containing space 10A, the a part of the fixed electrode 12 and the movable portion 13 are directly opposed to each other, where the movable portion 13a is movable above the fixed electrode 12 in a direction changing an opposing distance between the electrode 12 and the movable portion 13a.

In the example shown in the drawing, the compensation resistance R11 and the reference resistance R12 are arranged such that extension directions of the resistance layers are linearly positioned above the substrate. In addition, the resistances R11 and R12 are formed such that the extension directions of the resistances R11 and R12 are parallel to extension directions of the fixed electrode 12 and the movable electrode 13 (a direction coincident with a direction in which the movable electrode 13 is projected above the fixed electrode 12 in the example of the drawing) above the substrate.

Figure 8B:
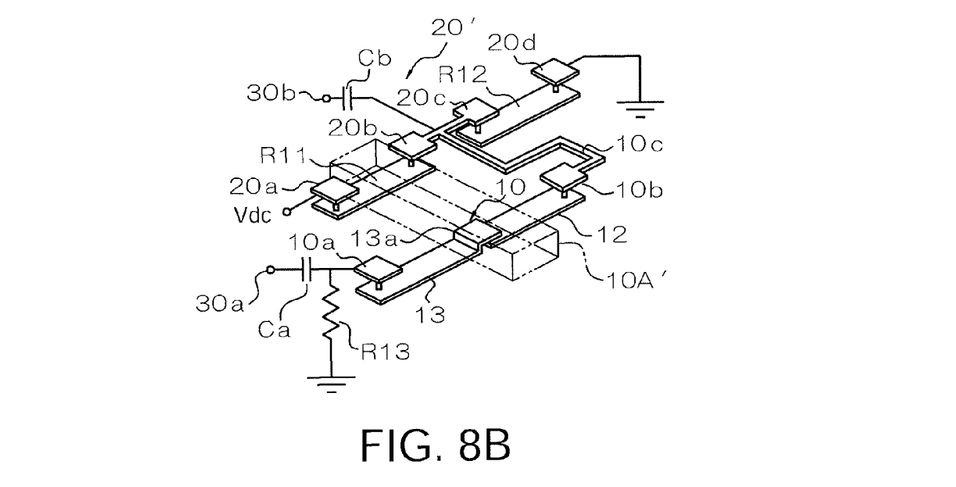

FIG. 8B is a schematic fragmentary perspective view showing another structural example different from the structure of FIG. 8A in the first embodiment. Connections among the terminals and between the terminals and the wire are the same as those in the structure described above, and thus, description of thereof will be omitted below. The present structural example is different from that shown in FIG. 8A in that the compensation resistance R11 is arranged within a containing space 10A' formed above the substrate. In this manner, arranging the compensation resistance R11 within the containing space 10A' including the MEMS resonator 10 therein allows the movable portion 13a and the compensation resistance R11 to be formed under a same production condition.

Also in the example of FIG. 8B, the compensation resistance R11 and the reference resistance R12 are arranged such that extension directions of the resistance layers are linearly positioned above the substrate. Additionally, the extension directions of the compensation resistance R11 and the reference resistance R12 are arranged parallel to the extension directions of the fixed electrode 12 and the movable electrode 13 (the direction coincident with the direction in which the movable electrode 13 is projected above the fixed electrode 12 in the example of the drawing) above the substrate. Meanwhile, in this example, the MEMS resonator 10 including the movable portion 13a is positioned adjacent to the compensation resistance R11 in a direction intersecting with (orthogonal to) the extension direction. In other words, there is not any other conductive element such as a conductive layer or a wire between the MEMS resonator 10 and the compensation resistance R11 above the substrate. Thus, arranging the movable portion 13a and the compensation resistance R11 adjacent to each other as above can increase a similarity between film thickness values dependent on film-formation conditions upon the formation of the 13a and the R11, thereby improving compensation effect of the R11 on the resonance frequency.

In the present embodiment, the containing space 10A' is extended in the direction intersecting with (orthogonal to) the extension directions mentioned above so as to contain both the movable portion 13a and the compensation resistance R11 that are adjacent to each other. In this manner, when the movable portion 13a and the compensation resistance R11 are both arranged in the containing space 10A', etching performed to form the containing space 10A' influences equally on both the movable portion 13a and the compensation resistance R11. This can prevent the similarity of the film thickness between both the movable portion 13a and the compensation resistance R11 from being reduced depending on a presence or absence of the etching step.

Figure 9:
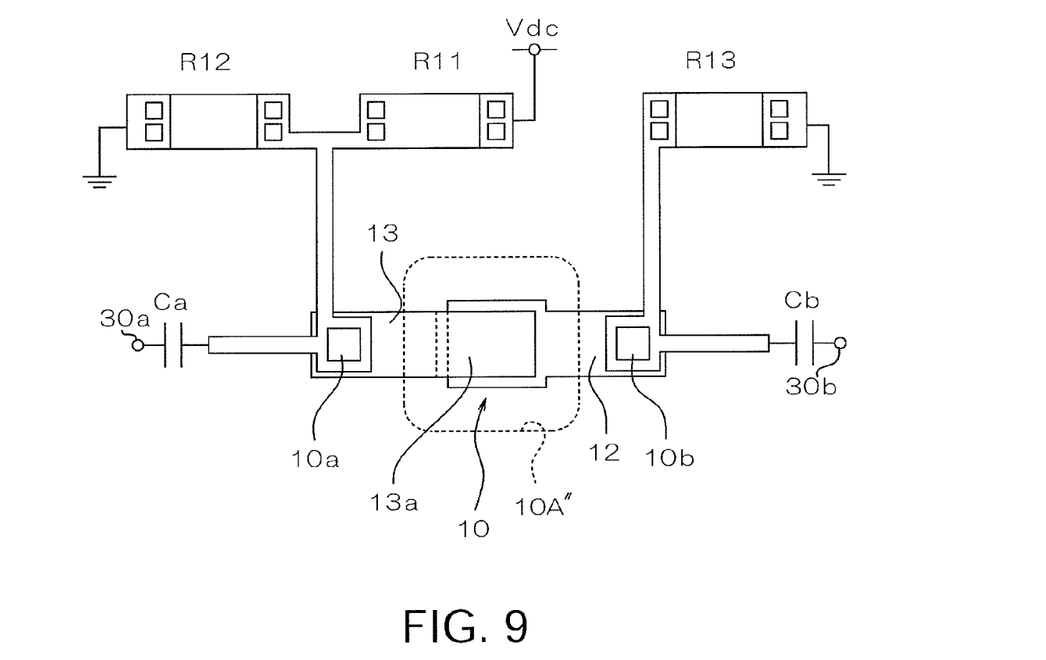
FIG. 9 is a schematic plan view showing another rather specific example of the arrangement of the constituent elements in the resonant circuit.

FIG. 9 is a schematic plan view showing an example of a planar structure different from the above structure. Also in FIG. 9, a part of the connection relationship among the circuit elements is typically shown by lines. This example is the same as the above example in that the movable portion 13a is connected to the first terminal 10a and the fixed electrode 12 is connected to the second terminal 10b. However, the first terminal 10a is connected to a junction between the compensation resistance R11 and the reference resistance R12, and the second terminal 10b is connected to a ground resistance R13. The other end of the ground resistance R13 is connected to a ground potential. In addition, the first terminal 10a is connected to an input-side coupling capacitance (not shown), and the second terminal 10b is connected to an output-side coupling capacitance (not shown). Also in this structure, the compensation resistance R11 is arranged adjacent to the MEMS resonator 10 including the movable portion 13a. The MEMS resonator 10 with the movable portion 13a is contained in a containing space 10A". In this case, the containing space 10A" may be enlarged to also contain the adjacent compensation resistance R11.

The structures shown in FIGS. 8A, 8B and FIG. 9 may be changed such that the fixed electrode 12 is connected to the first terminal 10a and the movable electrode 13 is connected to the second terminal 10b. Furthermore, preferably, the electrodes and the resistances are all formed of a polysilicon layer. In general, there can be easily obtained a value of approximately 1.0 to 2.0 kohm/square, as a sheet resistance of the polysilicon layer.

Figure 10:
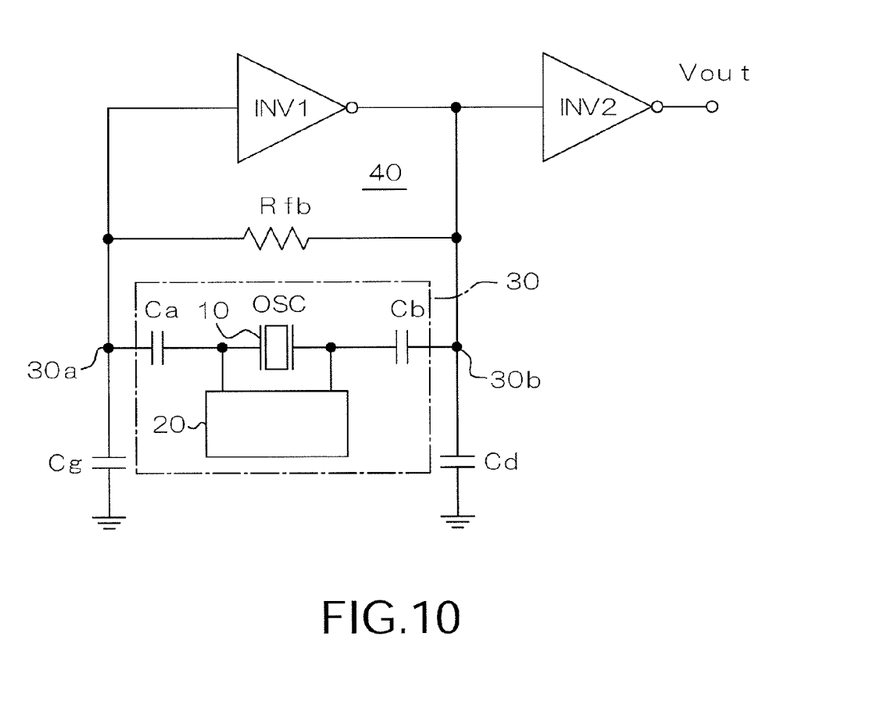
FIG. 10 is a circuit diagram showing a structural example of an electronic device including the resonant circuit.

FIG. 10 is a schematic circuit structural diagram showing an embodiment of an electronic device including the resonant circuit 30 according to the first embodiment and a signal circuit 40 connected to the resonant circuit 30. In an example of the electronic device shown in FIG. 10, there is shown an oscillation circuit using the resonant circuit 30 of the first embodiment. For the example of the electronic device, the resonant circuit 30' of the second embodiment may be used as an alternative to that of the first embodiment.

In the electronic device of the embodiment, an input terminal 30a and an output terminal 30b of the resonant circuit 30 are connected to the signal circuit 40. The signal circuit 40 includes an amplifier circuit INV1 having a positive resistance connected parallel to the resonant circuit 30 and a feedback resistance Rfb connected parallel to the resonant circuit 30. Additionally, the amplifier circuit INV1, the feedback resistance Rfb, and the opposite ends (the input terminal 30a and the output terminal 30b) of the resonant circuit 30 are connected to respective constant potentials (respective ground potentials). Furthermore, those parallel circuits are connected to an amplifier circuit INV2, which outputs an output potential Vout.

Figure 11A:
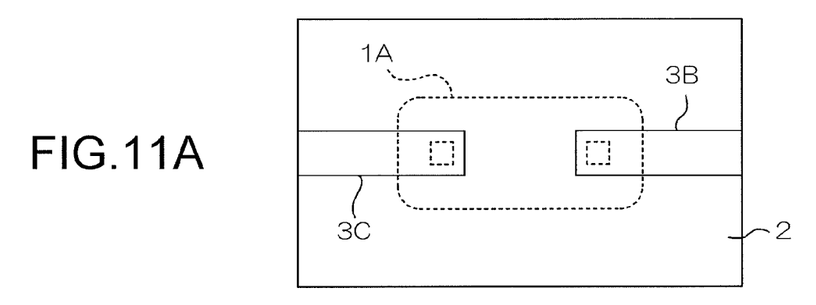
FIGS. 11A and 11B are a fragmentary plan view and a fragmentary sectional view showing a structural example of a reference resistance element.
Figure 11B:
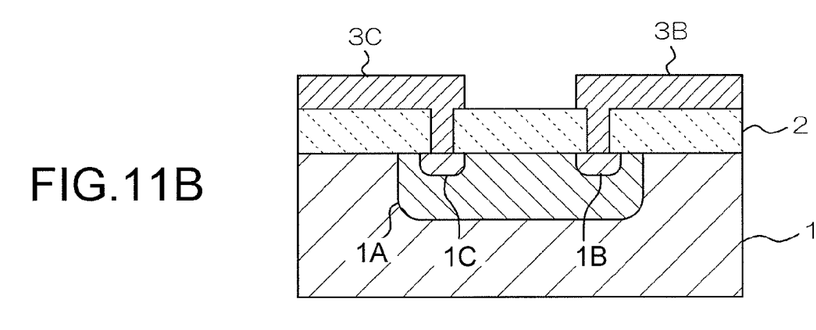

FIGS. 11A and 11B are a fragmentary plan view and a fragmentary sectional view showing a structural example of each of the reference resistances such as the resistances R12 and R14 included in the bias voltage supplying section 20. This is a structural example in which the MEMS resonator 10 and the bias circuit 20 are both to be formed above the substrate 1 made of a semiconductor material. First, on the semiconductor substrate 1 such as a silicon substrate is formed an insulating film 2 made of silicon oxide or the like. Next, on the insulating film 2 are formed wire sections 3B and 3C made of aluminum or the like. An impurity region 1A is provided in a surface layer portion of the substrate 1. At each surface portion within the impurity region 1A are formed contact regions 1B and 1C having conductivity improved by increasing an impurity concentration to a level higher than the impurity region 1A. In this case, if the substrate 1 is a p-type substrate, the impurity region 1A is an n-type impurity region and each of the contact regions 1B, 1C is a highly concentrated n-type impurity region. The wiring sections 3B and 3C, respectively, are conductively connected to the contact regions 1B and 1C, respectively, via through-holes of the insulating film 2.

As described above, since the reference resistance R12 is formed of the impurity region 1A formed on the top surface portion of the substrate 1, the material and the formation method of the reference resistance R12 are different from those of the compensation resistance R11. Thus, the reference resistance R12 can be formed as a resistance element having a structural size dissimilar to that of the movable portion 13a formed above the substrate 1. In this case, a resistance value can be appropriately set depending on an impurity concentration of and a region size of the impurity region 1A, a plane distance between the contact regions 1B and 1C, and the like. In addition, a main part of the resistance element is formed in the surface layer portion of the substrate 1 and thus hardly influences the structure formed above the substrate 1, thereby increasing flexibility to design for the structure formed thereon.

Figure 12A:
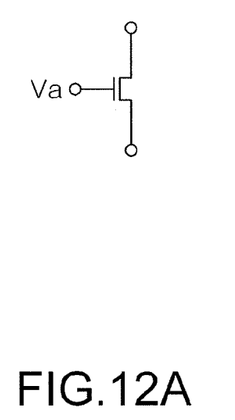
FIGS. 12A to 12C are circuit diagrams showing other structural examples of the reference resistance element.
Figure 12B:
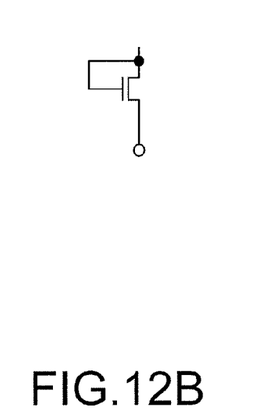
Figure 12C:
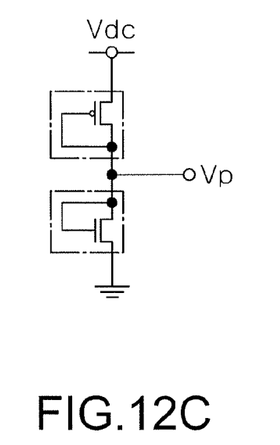

FIGS. 12A to 12C are schematic circuit diagrams showing other structural examples of the reference resistance. The example of FIG. 12A shows a resistance element that is a channel resistance obtained when a predetermined gate voltage is applied to a gate of a field effect transistor (FET) formed above the substrate; and the example of FIG. 12B shows a resistance element that is a constant current source formed by connecting the gate of the transistor to a source thereof. In the example shown in FIG. 12C, a gate of each of p-channel-type and n-channel-type metal-oxide-semiconductor field effect transistors (MOSFETs) is connected to a source thereof to form voltage divider circuits that are connected in series. In this example, the bias circuit described above can be formed by using one of the voltage divider circuits as the reference resistance and replacing the other one of the voltage divider circuits by the above-described compensation resistance.

The reference resistance may be a resistance element such as a polysilicon resistance formed in the substrate and adjusted by trimming or the like so as to have a desired value. In addition, the reference resistance may be an external element arranged outside the substrate having the MEMS resonator formed thereon. In short, it is only necessary for the reference resistance to be formed of a structure or an element working with at least one of the compensation resistances R11 and R15 and having a constant resistance value.

Figure 13A:
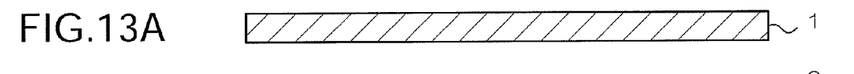
FIGS. 13A to 13H are schematic sectional views of steps showing an example of a method for producing the resonant circuit of the first embodiment.
Figure 13B:
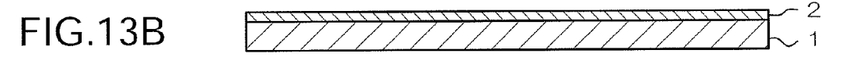
Figure 13C:
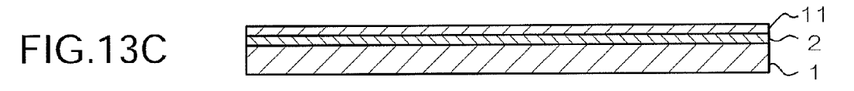

Now, with reference to FIGS. 13A to 13H, a description will be given an example of a method for producing the resonant circuit of the first embodiment. In this example, first, there is prepared the semiconductor substrate 1 (such as a p-type semiconductor substrate made of monocrystalline silicon or the like) shown in FIG. 13A. Next, as shown in FIG. 13B, the insulating film 2 made of silicon oxide or the like is formed on the substrate 1. Then, as shown in FIG. 13C, on the insulating film 2, there is formed the base layer 11 that is particularly provided under the MEMS resonator 10. The base layer 11 is formed of an insulating film made of silicon nitride or the like and serves as a release-etching stopper layer in a release step described below.

Figure 13D:
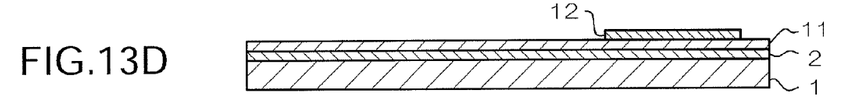
Figure 13E:
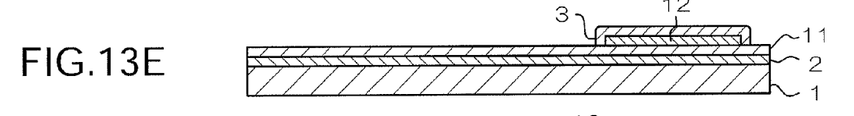

Thereafter, as shown in FIG. 13D, on the base layer 11, there is formed a film as the first conductive layer made of conductive polycrystalline silicon or the like. Then, the film is patterned to form the fixed electrode 12. For example, this step may be accomplished as follows: 1) impurity implantation is performed after forming the film of polycrystalline silicon to provide conductivity; 2) a resist layer is formed; and 3) patterning is performed by etching or the like. Next, as shown in FIG. 13E, on the fixed electrode 12 is formed a sacrificial layer 3 formed of an insulating film made of phosphosilicate glass (PSG) or the like. The sacrificial layer 3 may be formed of a thermal oxide film generated by thermal oxidization of the fixed electrode 12.

Figure 13F:
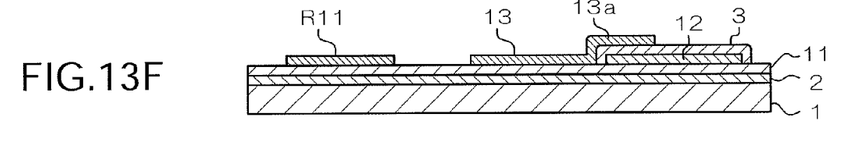

Additionally, as shown in FIG. 13F, on the sacrificial layer 3, there is formed a film as the second conductive layer made of conductive polycrystalline silicon or the like, similar to the first conductive layer. The film of the second conductive layer is patterned to form the movable electrode 13 and the resistance layer R11 simultaneously. The movable electrode 13 includes the movable portion 13a opposing the fixed electrode 12 as described above. The resistance layer R11 is the above-described compensation resistance and is made of the same material by using the same method (the same film-forming process and the same patterning process) as in the movable electrode 13 (the movable portion 13a). Accordingly, basically, the movable portion 13a and the resistance layer R11 are formed with the same amount of the film and the same patterning precision, so that the structural sizes of the 13a and the R11, such as thicknesses, lengths of planar shapes, and variations in widths, tend to be associated with each other. In other words, in general, as a certain structural size of the movable portion 13a becomes larger than a design value, the same structural size of the resistance layer R11 becomes larger than a design value. Particularly, the thicknesses of the movable portion 13a and the resistance layer R11 are primarily made small. Thus, variation rates of the thicknesses thereof are significantly increased as compared to those of the other structural sizes. This has greater influence on the resonance frequency, as described above.

At steps of FIGS. 13D, 13E, and 13F, the base layer 11 is left in a formation region for the compensation resistance R11 to form the R11 on the base layer 11. As described above, the base layer 11 generally serves as the etching stopper layer protecting the lower layer structure from release etching for forming the containing space 10A. Accordingly, the base layer 11 may be formed only in the region where the containing space 10A is formed later, while being removed from a region where the compensation resistance R11 is formed, namely a region excluding the containing space 10A. In this case, the compensation resistance R11 may be formed on the insulating film 2.

Figure 13G:
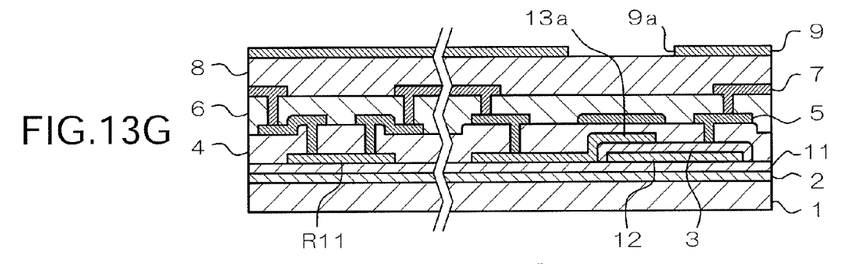
Figure 13H:
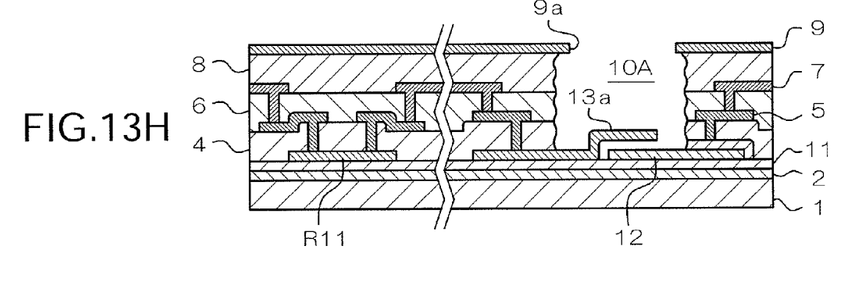

Then, as shown in FIG. 13G, interlayer insulating films 4, 6, and 8 made of silicon oxide or the like and wiring layers 5 and 7 made of aluminum or the like are alternately laminated one on another. In addition, although not shown in the drawing, the substrate 1 also includes a structure having the reference resistance R12 as another resistance layer, another resistance layer R13, and a wiring part connecting those resistance layers, whereby the bias circuit 20 is integrally formed above the substrate 1. The MEMS resonator 10 is connected to the bias circuit 20 via the wiring layer s 5 and 7. Furthermore, preferably, a structure including the signal circuit 40 is also formed integrally above the substrate 1 to allow the electronic device to be integrated.

On the interlayer insulating film 8 is formed a protective film 9 made of a resin such as a resist, silicon nitride or the like. The protective film 9 has an opening portion 9a formed at a position above the MEMS resonator 10. The opening portion 9a is used to remove the sacrificial layer 3 and the interlayer insulating films 4, 6, and 8 under the opening portion 9a therethrough by using an etching liquid or gas, such as buffered hydrofluoric acid, so as to form the containing space 10A shown in FIG. 13H (the release step). This releases the movable portion 13a so as to be movable, thereby enabling the MEMS resonator 10 to be operated.

Additionally, as shown in FIG. 8B, even in the case of the formation of the containing space 10A' containing the resistance layer R11, the production method is the same as in the above description. In this case, a range removed at the release step is set so as to include a region where the resistance layer R11 is formed.

FIGS. 14A to 14H are schematic step sectional views showing another example of the production method described above. In this method, as shown in FIGS. 14A to 14D, the steps of sequentially forming the insulating film 2, the base layers 11, and the fixed electrode 12, respectively, on the substrate 1 are the same as those in FIGS. 13A to 13D.

Figure 14A:
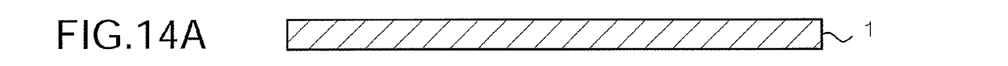
FIGS. 14A to 14H are schematic sectional views of steps showing another example of the method for producing the resonant circuit.
Figure 14B:
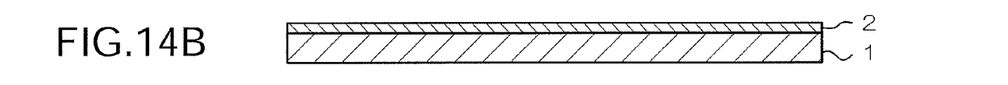
Figure 14C:
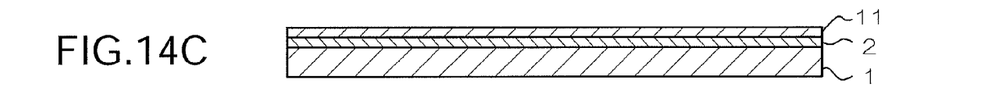
Figure 14D:
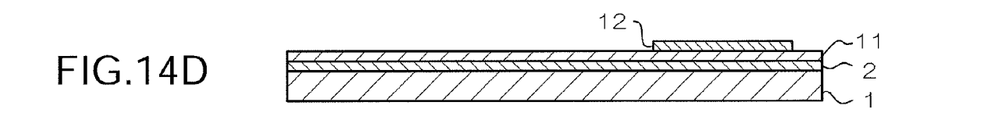
Figure 14E:
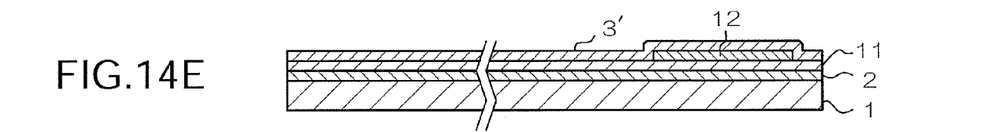
Figure 14F:
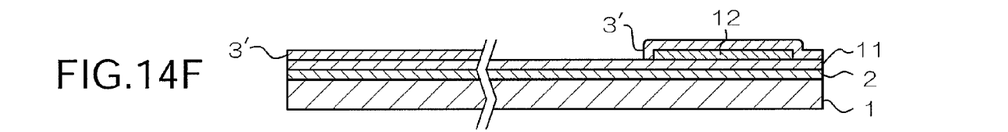

Thereafter, as shown in FIG. 14E, an insulating film 3' made of silicon oxide or the like is entirely formed by CVD, thermal oxidization, or the like, and then patterned to remove a region where a supportive portion of the movable electrode 13 is formed, as shown in FIG. 14F. At that point in time, the insulating film 3' is left in a region where the compensation resistance R1 is to be formed.

Figure 14G:
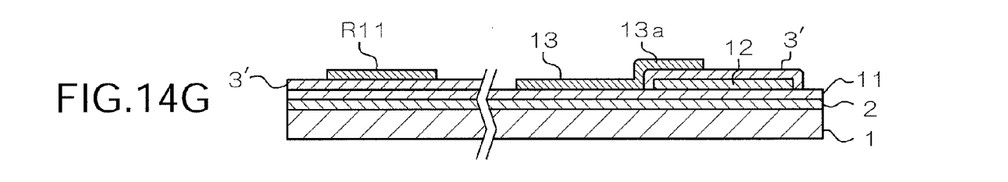
Figure 14H:
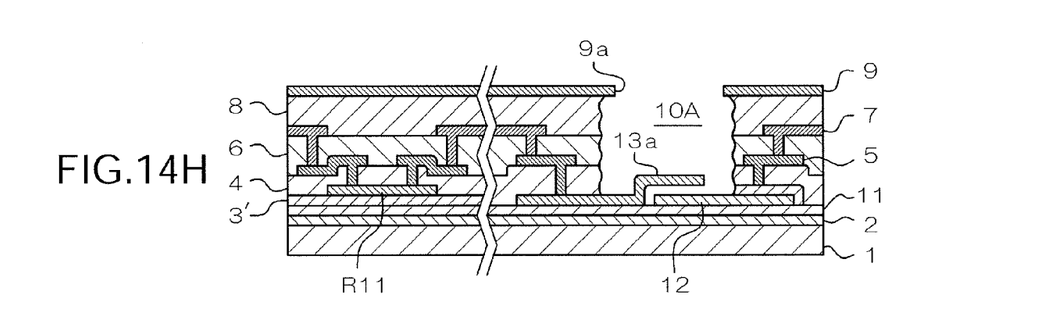

Next, as shown in FIG. 14G, a film of the second conductive layer is formed as above and patterned to simultaneously form the movable electrode 13 and the resistance layer R11. In this case, the movable portion 13a and the compensation resistance R11 are both formed on the insulating film 3' as a same base layer, so that film-formation conditions for the movable portion 13a and the compensation resistance R11 can be further equalized. Accordingly, states of thickness changes in the movable portion 13a and the compensation resistance R11 can be made more similar to each other, thereby further improving the above-described compensation effect of the compensation resistance R11 on the resonance frequency. Meanwhile, the supportive portion of the movable electrode 13 excluding the movable portion 13a is provided on the base layer 11 in a region where the insulating film 3' is not formed. After that, as in FIG. 13H, an upper structure is formed as shown in FIG. 14H, and then, the containing space 10A is formed at the release step.

The embodiments described above are mere examples for implementing the invention. Thus, embodiments of the invention are not restricted to those exemplified above and, for example, can be provided in arbitrary combinations as long as features of the embodiments are consistent with each other.

Therefore, it should be obvious that various modifications are possible without departing from the scope of the invention.

The entire disclosure of Japanese Patent Application Nos. 2008-158847, filed Jun. 18, 2008 and 2009-075911, filed Mar. 26, 2009 are expressly incorporated by reference herein.

What is claimed is:

1. A resonant circuit, comprising:
   a substrate;
   a MEMS resonator including a fixed electrode and a movable electrode formed above the substrate and having a first terminal and a second terminal, the movable electrode having a movable portion opposing at least a part of the fixed electrode; and
   a voltage applying unit applying a bias voltage to the MEMS resonator, the voltage applying unit including a voltage divider circuit that includes a compensation resistance formed of a same layer as that of the movable portion to allow a resistance value to be changed by a thickness of the layer and a reference resistance formed of a layer different from that of the movable portion and connected to the compensation resistance to output a junction potential between the compensation resistance and the reference resistance to at least one of the first and the second terminals of the MEMS resonator.

2. The resonant circuit according to claim 1, wherein the voltage applying unit outputs the junction potential to one of the first and the second terminals of the MEMS resonator and outputs another potential to an other one of the terminals of the MEMS resonator.

3. The resonant circuit according to claim 2, wherein, in the voltage divider circuit, the compensation resistance and the reference resistance are connected in series between a high potential and a low potential; and when the junction potential is higher than the another potential, the compensation resistance is connected to the high potential and the reference resistance is connected to the low potential, whereas when the junction potential is lower than the another potential, the compensation resistance is connected to the low potential and the reference resistance is connected to the high potential.

4. The resonant circuit according to claim 1 further including an input coupling capacitance and an output coupling capacitance, wherein the input coupling capacitance is connected between the first terminal of the MEMS resonator and an input terminal of the resonant circuit, and the output coupling capacitance is connected between the second terminal of the MEMS resonator and an output terminal of the resonant circuit.

5. The resonant circuit according to claim 1, wherein the movable portion is formed of a conductive layer made of a same material as that of the compensation resistance, whereas the reference resistance is formed of a conductive layer made of a material different from that of the conductive layer forming each of the movable portion and the compensation resistance.

6. The resonant circuit according to claim 1, wherein the movable portion and the compensation resistance are each formed of a conductive layer and adjacent to each other.

7. The resonant circuit according to claim 1, wherein the movable portion and the compensation resistance are contained in a same containing space.

8. An electronic device including the resonant circuit according to claim 1 and a signal circuit connected to the resonant circuit, the resonant circuit and the signal circuit being formed above a same substrate.

9. The electronic device according to claim 8, wherein the movable portion and the compensation resistance are both arranged in a containing space formed above the substrate.

10. The electronic device according to claim 8, wherein the signal circuit includes an amplifier circuit having a negative resistance to form an oscillation circuit.

11. A resonant circuit, comprising:
    a substrate;
    a MEMS resonator including a fixed electrode and a movable electrode formed above the substrate and having a first terminal and a second terminal, the movable electrode having a movable portion opposing at least a part of the fixed electrode; and
    a voltage applying unit including a first circuit supplying a first potential to the first terminal of the MEMS resonator and a second circuit supplying a second potential to the second terminal of the MEMS resonator to apply a bias voltage corresponding to a difference between the first and the second potentials to the MEMS resonator, at least one of the first and the second circuits being a voltage divider circuit including a compensation resistance formed of a same layer as that of the movable portion to allow a resistance value to be changed by a thickness of the layer and a reference resistance formed of a layer different from that of the movable portion and connected to the compensation resistance to output a junction potential between the compensation resistance and the reference resistance as the first potential or the second potential.

12. A method for producing a resonant circuit including a MEMS resonator having a fixed electrode and a movable electrode with a movable portion opposing at least a part of the fixed electrode and a voltage applying unit applying a bias voltage to the MEMS resonator, the method comprising:
    forming the movable portion and a compensation resistance using a same layer; and
    forming a reference resistance using a layer different from that of the movable portion and the compensation resistance, so as to form a voltage divider circuit including the compensation resistance and the reference resistance in the voltage applying unit to output a junction potential between the compensation resistance and the reference resistance to at least one of terminals of the MEMS resonator.

13. The method for producing a resonant circuit according to claim 12, wherein the movable portion is formed of a conductive layer formed by using a same material and a same method as in the compensation resistance, whereas the reference resistance is formed of a conductive layer formed by using a material and a method different from those of the movable portion and the compensation resistance.

14. The method for producing a resonant circuit according to claim 12, wherein the movable portion and the compensation resistance are each formed of a conductive layer and adjacent to each other.

15. The method for producing a resonant circuit according to claim 12 further including forming a containing space for containing both the movable portion and the compensation resistance.

* * * * *